(12) United States Patent
Fleischer et al.

(10) Patent No.: US 9,088,279 B2
(45) Date of Patent: Jul. 21, 2015

(54) MARGIN IMPROVEMENT FOR CONFIGURABLE LOCAL CLOCK BUFFER

(71) Applicant: International Business Machines Corporation, Armonk, NY (US)

(72) Inventors: Bruce M. Fleischer, Bedford Hills, NY (US); James D. Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 14/034,970

(22) Filed: Sep. 24, 2013

(65) Prior Publication Data

US 2015/0084673 A1    Mar. 26, 2015

(51) Int. Cl.
*H03K 19/096*    (2006.01)

(52) U.S. Cl.
CPC .................................... *H03K 19/096* (2013.01)

(58) Field of Classification Search
CPC ...... G11C 7/22; G11C 7/222; G11C 11/4076; G06F 1/10; G06F 1/04; H03K 5/1565; H03K 5/133
See application file for complete search history.

(56) References Cited

U.S. PATENT DOCUMENTS

| | | | |
|---|---|---|---|
| 5,418,406 A * | 5/1995 | Hirano et al. | ................. 327/172 |
| 5,539,337 A | 7/1996 | Taylor et al. | |
| 6,049,236 A | 4/2000 | Walden | |
| 6,452,435 B1 * | 9/2002 | Skergan et al. | ............... 327/293 |
| 6,822,500 B1 | 11/2004 | Warnock et al. | |
| 6,825,695 B1 | 11/2004 | Dhong et al. | |
| 7,864,625 B2 | 1/2011 | Carpenter et al. | |
| 8,060,771 B2 | 11/2011 | Tyrrell | |
| 8,295,121 B2 | 10/2012 | Kim | |
| 2007/0080722 A1 | 4/2007 | Chu et al. | |

FOREIGN PATENT DOCUMENTS

| | | |
|---|---|---|
| JP | 10-188561 | 7/1998 |
| JP | 10-303725 | 11/1998 |
| KR | 100318321 B1 | 12/2001 |
| KR | 100675006 B1 | 1/2007 |
| KR | 100924351 B1 | 11/2009 |

* cited by examiner

*Primary Examiner* — Jany Richardson
(74) *Attorney, Agent, or Firm* — Keivan Razavi; Margaret Pepper

(57) ABSTRACT

A timing margin circuit of a local clock buffer circuit may include an inverter logic gate having an inverter input and an inverter output, whereby the inverter input receives an input clock signal. A NAND logic gate includes a first NAND input coupled to the inverter output, a second NAND input, and a NAND output. The circuit also includes a logic device having a first logic device input that is coupled to the inverter output, a second logic device input that receives a mode selection signal, and a logic device output that couples to the second NAND input, whereby the NAND logic gate generates a first time delayed input clock signal and a second time delayed input clock signal, such that the first and the second time delayed input clock signal control a falling edge transition of a local clock signal derived from the input clock signal.

17 Claims, 6 Drawing Sheets

MARGIN IMPROVEMENT FOR CONFIGURABLE LOCAL CLOCK BUFFER

BACKGROUND a. Field of the Invention

The present invention generally relates to microelectronic devices, and more particularly to maintaining the timing performance of such microelectronic devices using clock buffer circuitry.

b. Background of Invention

As devices shrink, their operational variability also increases. Particularly, as new technologies emerge, in the interest of power consumption reduction, the device operating voltages also decrease with reduced device size. The impact of this device variability in turn may also be further increased by the reduced device operating voltages. A critical variability in device operation may, for example, be propagation delays through the device. Thus, device size reductions leading to reduced operating voltages may create unpredictable variations in the propagation times (i.e., delay) though the devices. In certain circuit implementations such as clock buffer circuits, these propagation delay changes may cause timing differences that subsequently lead to operational failures imposed by the potential occurrence of race conditions.

BRIEF SUMMARY

According to one exemplary embodiment, a timing margin circuit of a local clock buffer circuit located within a microelectronic device is provided. The timing margin circuit may include an inverter logic gate having an inverter input and an inverter output, whereby the inverter input receives an input clock signal. A NAND logic gate includes a first NAND input that is coupled to the inverter output, a second NAND input, and a NAND output. Also included is a logic device having a first logic device input that is coupled to the inverter output, a second logic device input that receives a mode selection signal, and a logic device output that couples to the second NAND input. The NAND logic gate generates, at the NAND output, a first time delayed input clock signal having a first time delay based on the mode selection signal being at a first logic state. The NAND logic gate also generates, at the NAND output, a second time delayed input clock signal having a second time delay based on the mode selection signal being at a second logic state. The first and the second time delayed input clock signal control a falling edge transition of a local clock signal derived from the input clock signal.

According to another exemplary embodiment, a timing margin circuit of a local clock buffer circuit located within a microelectronic device is provided. The timing margin circuit may include a chain of inverters having an inverter input and an inverter output, whereby the inverter input receives an input clock signal. A NOR logic gate includes a first NOR input coupled to the inverter output of the chain of inverters, a second NOR input coupled to an output clock signal that is the inverse of the input clock signal, and a NOR output. The NOR gate generates, at the NOR output, a time delayed input clock signal for controlling a falling edge transition of the output clock signal following the output clock signal completing a transition to a logic high.

According to an exemplary embodiment, a method of providing a timing margin for a local clock buffer circuit located within a microelectronic device is provided. The method may include receiving an input clock signal and delaying the received input clock signal along a first delay path having a first chain of inverter logic according to a first operating mode. A first falling edge transition of an output clock signal that is derived from the input clock signal is then controlled based on the delaying of the input clock along the first delay path. The received input clock signal may be delayed along a second delay path having a second chain of inverter logic according to a second operating mode, whereby a second falling edge transition of the output clock signal is controlled based on the delaying of the input clock along the second delay path. The first falling edge transition of the output clock signal corresponds to a pulse mode operation of the local buffer and the second falling edge transition of the output clock signal corresponds to a master/slave operation of the local buffer.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following one or more exemplary embodiments describe a local clock buffer circuit that introduces a timing margin into controlling the clock signal in order to avoid race conditions.

Figure 1A:
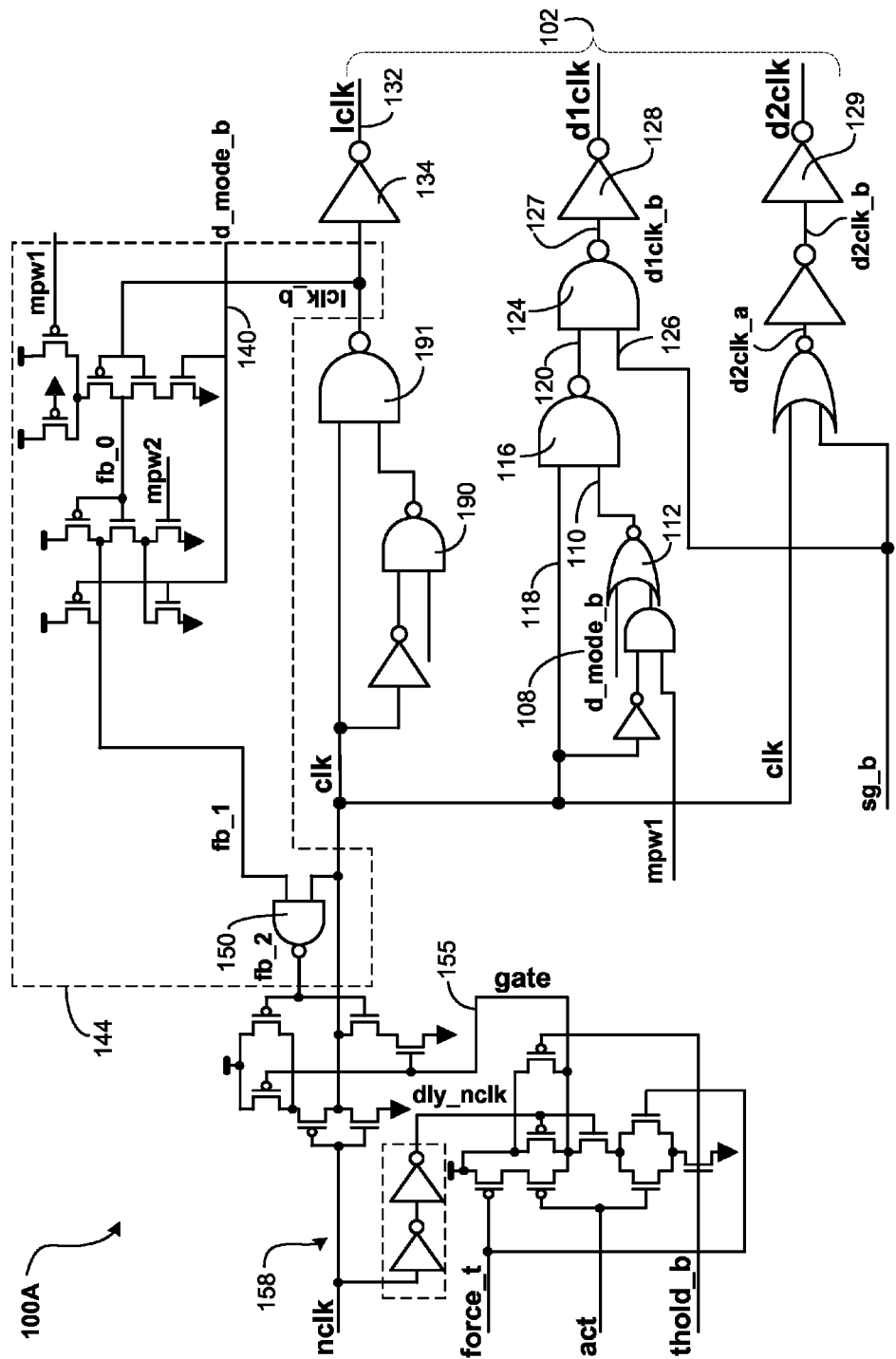
FIG. 1A is a local clock buffer circuit, according to an exemplary embodiment.
Figure 1B:
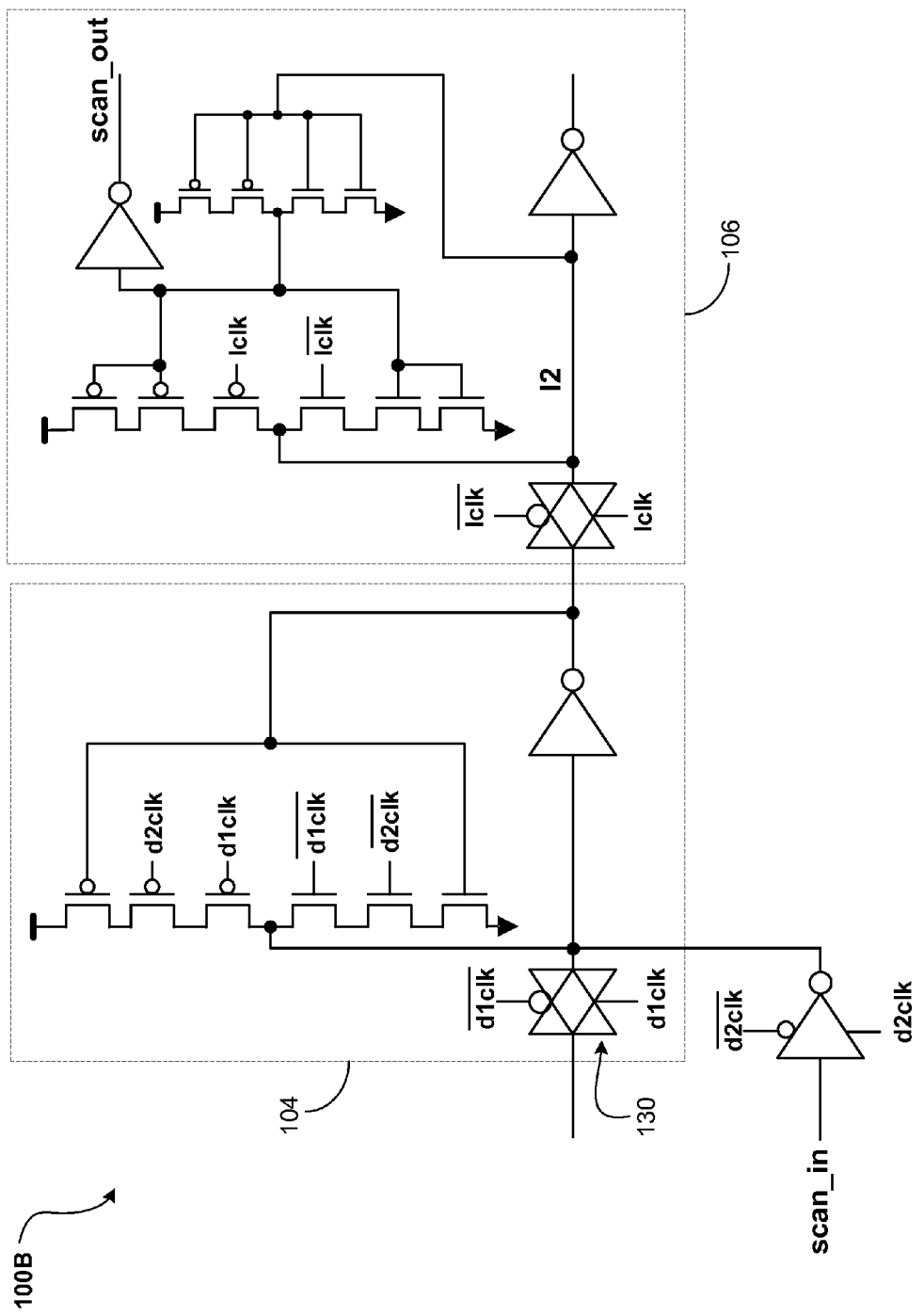
FIG. 1B is an exemplary master/slave circuit that is clocked by the local clock buffer circuit of FIG. 1A.

Referring to FIG. 1A, a local clock buffer circuit 100A may be used to drive sequential devices such as, for example, a plurality of latches (e.g., 30 latches). As depicted in FIG. 1B, the outputs 102 of the local clock buffer circuit 100A are used to drive an exemplary latch circuit 100B including a master latch 104 and a slave latch 106 stage. Specifically, the generated local clock signal lclk, the d1 clock d1clk, and the d2 clock d2clk of the local clock buffer circuit 100A, and their respective complementary signals (i.e., $\overline{lclk}$, $\overline{d1clk}$, $\overline{d2clk}$), are driving latch circuitry 100B.

Referring to FIG. 1A, the d_mode_b control input 108 may be utilized to place the local clock buffer circuit 100A in either a self-timed pulse operating mode or in a master/slave type operating mode. For example, when d_mode_b=1, the local clock buffer circuit 100A may be in the self-timed pulse operating mode. Thus, when d_mode_b=1, the output 110 of NOR gate 112 will default to logic 0. Output 110 is coupled to one input of NAND gate 116, while the other input 118 of NAND gate 116 receives the clk input signal. Since one input 110 of NAND gate 116 is held at logic 0, regardless of the other input 118 of NAND gate 116 transitioning between logic 1 and logic 0 based on receiving clock signal clk, the output 120 of NAND gate 116 will be held at logic 1. As depicted, output 120 of NAND gate 116 is coupled to one input of NAND gate 124 while the other input 126 of NAND gate 124 is coupled to a scan-enable control input sg_b. Since the scan-enable control input sg_b is held at logic 1 under normal functional operating conditions (i.e., scan enable deactivated) and the other input of NAND gate 124 is also held at logic 1, the output 127 of NAND gate 124 will be at logic 0. Thus, the d1clk signal output from inverter 128 will be held at logic 1. Referring to FIG. 1B, since the d1clk is held at logic 1, transmission gate 130 opens a transmission path from the master flip flop 104 straight through to slave flip flop 106. Thus, during the self-timed pulse operating mode, master/slave operation is deactivated. As further depicted in FIG. 1B, the d2clk signal and its complementary signal (i.e., $\overline{\text{d2clk}}$) output from inverter 129 (FIG. 1A) may be used to drive latch circuit 100B in a scan-chain test mode, whereby data is scanned in via the scan_in input and output at the scan_out output.

Alternatively, when the d_mode_b control input 108 is set as d_mode_b=0 and control input mpw2=0, the local clock buffer circuit 100A may be in the master/slave operating mode. Thus, the clock signal clk propagates through NAND gate 116, NAND gate 124, and inverter 128, whereby at the output 130 of inverter 128, generated clock signal d1clk is the complement of the lclk clock signal generated at output 132 of inverter 134. The generated complementary d1clk and lclk clock signals are used to drive the master/slave flip flops 104, 106 of the latch circuit 100B. In operation, the self-timed pulse operating mode may be used when operating a microelectronic device incorporating the local clock buffer circuit 100A during high operating voltages used for high performance applications. Alternatively, the master/slave operating mode may be used when operating a microelectronic device incorporating the local clock buffer circuit 100A during low operating voltages, where required hold times are greater and the low operating voltages may lead to timing issues resulting from the larger device delay variabilities.

In the master/slave mode of operation (i.e., master/slave), since d_mode_b control input 140 is set as d_mode_b=0, self-timed feedback path circuit 144 is shut off by forcing output fb_1 to logic 1. NAND gate 150 now operates as an inverter. Alternatively, in the self-timed pulse operating mode d_mode_b control input 140 is set as d_mode_b=1 and, therefore, self-timed feedback path circuit 144 is activated. Additionally, control inputs force_t and thold_b may be utilized for test purposes, while the act control input enables the gating of the clk signal via gate input 155.

In the above described exemplary embodiment, a built-in race condition may cause clocking issues. For example, when the clock input signal nclk falls from logic 1 (i.e., logic high) to logic 0 (logic low) and the control input signal gate is at logic 0 (i.e., logic low), a first condition that may need to be met is that the circuit design may be required to ensure that both the clk signal switches to logic 1 and fb_2 from feedback circuit 144 switches to logic 0 before the control input signal gate is forced high to a logic 1. Otherwise, for example, the clk signal may be prematurely pulled down to zero before being allowed to fully switch to logic 1. At lower operating voltages, the increased device delay variability may not allow the guarantee of such conditions. The circuit may further need to be designed to meet a second condition, to ensure that the control input signal gate is always forced high to a logic 1 in advance of when fb_1 falls, thus pulling fb_2 high to a logic 1. This in turn is meant to pull the clock signal clk down in accordance with the requirements of the self-timed pulse operating mode, but this will only happen if gate has previously switched to logic 1. Thus the gate signal must not be too early because of the first condition, but nor can it be made too late, due to the second condition. It should be noted that the second condition may only apply when operating in pulsed mode, since otherwise the fb_1 signal is held at a constant value of 1, and never switches. Portion 158 of the local clock buffer circuit 100A depicted in FIG. 1A is expanded and illustrated in FIG. 2.

Figure 2:
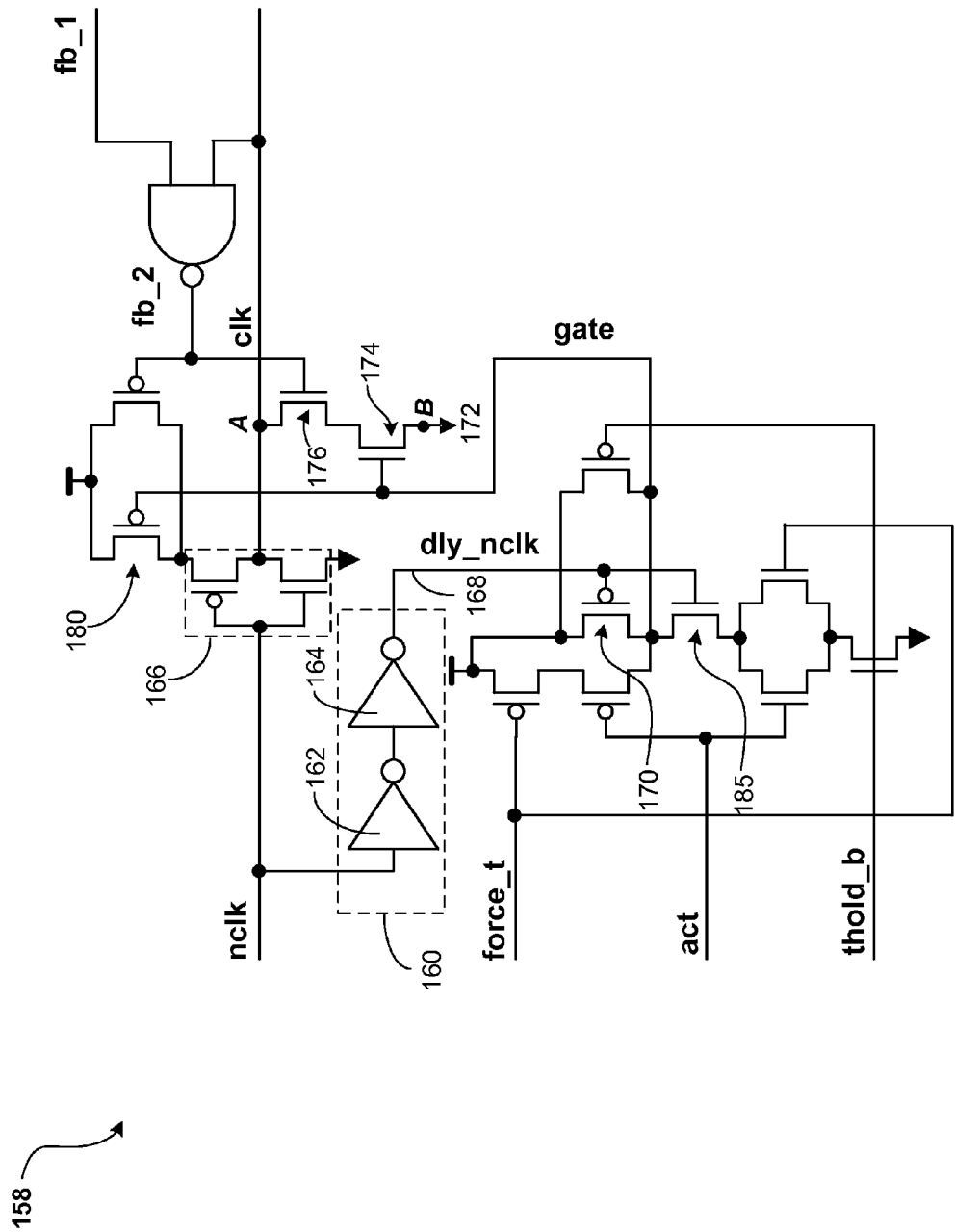
FIG. 2 illustrates an expanded view of a timing margin circuit incorporated within the clock buffer circuit of FIG. 1A, according to one exemplary embodiment.

As depicted in FIG. 2, the built-in race condition described above may, to some extent, be avoided by a timing margin circuit that includes delay path 160. Thus, as nclk falls to logic 0, this transition of nclk is delayed through inverters 162 and 164. Meanwhile, the clk signal at the output of inverter stage 166 is pulled high to logic 1, initiating the leading edge of the self-timed clock pulse. After the delay introduced by inverters 162 and 164, the dly_nclk signal at the output 168 of inverter 164 is also pulled low to logic 0. Since the dly_nclk signal is coupled to the gate input of PFET device 170, the logic 0 of the dly_nclk signal switches the PFET on and raises the control input signal gate to logic 1 in advance of fb_2 being pulled high to logic 1. As fb_2 is pulled high via the self-timed feedback path circuit 144 (FIG. 1A), the clk signal is pulled back to ground at 172 by NFET devices 174 and 176. Specifically, NFET device 174 is switched on by the control input signal gate being at logic 1, while NFET device 176 is switched on by fb_2 being pulled high to logic 1. Thus, a pathway to ground 172 is created between node A and B, which pulls clk signal back low again in accordance with the predetermined pulse width operation, thereby marking the terminating edge of the clock pulse.

Also, when nclk rises back up to logic 1, this transition of nclk is also delayed through inverters 162 and 164. Meanwhile, the clk signal at the output of inverter stage 166 is pulled low to logic 0. After the delay introduced by inverters 162 and 164, the dly_nclk signal at the output 168 of inverter 164 is also pulled high to logic 1. This causes PFET 170 to turn off and NFET 185 to turn on. Based on this, control input signal gate transitions to logic 0, pulling clk back up high to logic 1 via PFET 180.

As previously described, as the supply voltages are reduced (i.e., lower operating voltages) and the device delay variability increases, wider and wider pulse widths may be needed to maintain sufficient margin for writing the correct values into the latch within the window of the self-timed clock pulse. However, as the pulse widths of the clk signal become wider, the hold times of the latch circuit 100B (FIG. 1B) may become progressively worse, requiring an increased padding of latch-to-latch race paths in addition to the extra margin already required at the lower operating voltages due to increased device delay variability. Therefore, a practical limit is placed on the minimum operating voltage when running pulsed-clock latches.

Figure 3:
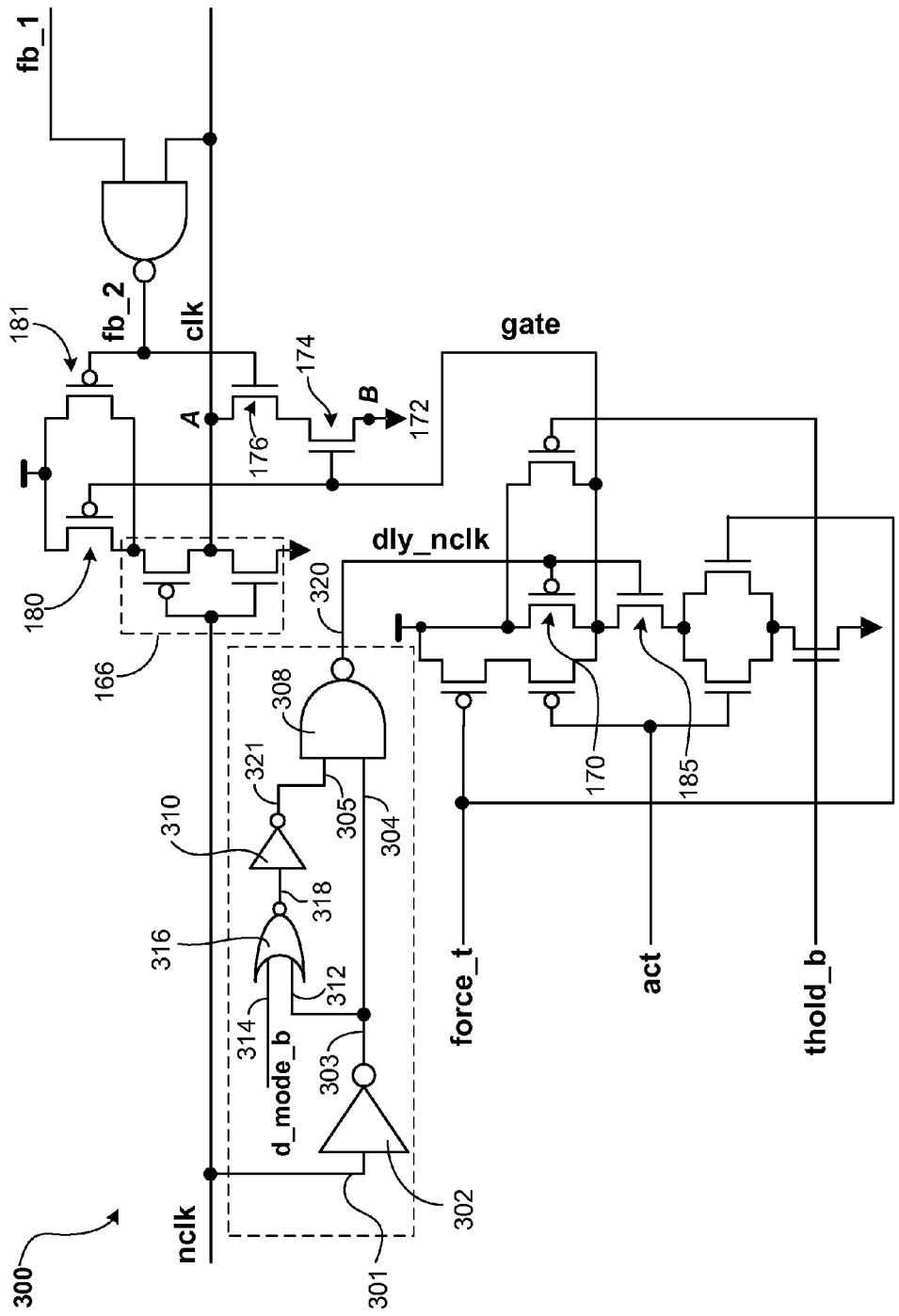
FIG. 3 illustrates an expanded view of an improved timing margin circuit incorporated within the clock buffer circuit of FIG. 1A, according to one exemplary embodiment.

FIG. 3 illustrates an expanded view of a timing margin circuit 300 incorporated within the clock buffer circuit of FIG. 1A, according to one exemplary embodiment. The timing margin circuit 300 may include an inverter gate 302 and a NAND gate 308, whereby the output 303 of inverter 302 couples to input 304 of the NAND gate 308. Input 301 of inverter 302 receives nclk as an input clock signal. The timing margin circuit 300 may also include a logic device that includes inverter gate 310 and NOR gate 316, whereby the output 318 of NOR gate 316 couples directly to the input of inverter gate 310. Output 303 of inverter 302 additionally couples to input 312 of the NOR gate 316, while input 314 of the NOR gate 316 receives mode selection control input signal d_mode_b. As previously described, the d_mode_b mode selection control input may be set to logic 1 during the pulse operating mode and alternatively set to logic 0 during the master/slave (i.e., latched). Output 321 of the inverter 310 couples to the other input 305 of the NAND gate 308. The output 320 of NAND gate 308 generates the dly_nclk signal for controlling the gate signal control input.

The timing margin circuit 300 may utilize the d_mode_b mode selection control input to generate different time delayed input clock signals dly_nclk each with different race condition margins. For example, based on the d_mode_b mode selection control input being set to logic 1 during the pulse operating mode (i.e., a pulsed clock mode), input 314 of NOR gate 316 will accordingly be set to logic 1, forcing output 318 to logic 0, and, therefore, output 321 of inverter 310 is set at logic 1. Thus, the output 321 of inverter 310 holds input 305 of NAND gate 308 at logic 1. This causes the NAND gate 308 to logically operate as an inverter device and, thereby, inverting any signal received at input 304 based on the output 303 from inverter 302. In this pulse operating mode, timing margin circuit 300 operates in the same or similar manner than the timing margin circuit (see FIG. 2) that includes delay path 160 (FIG. 2). As with delay path 160 (FIG. 2), which includes inverters 162 and 164, timing margin circuit 300 now exhibits a delay path that includes inverter 302 and NAND gate inverter 308.

Thus, in pulse mode operation, as nclk falls to logic 0, this transition of nclk is delayed through inverter 302 and NAND gate inverter 308, thus having a delay similar to the design shown in FIG. 1A. This embodiment of the timing margin circuit 300 may be subject to the same two timing constraints described above in the discussion of the embodiment of FIGS. 1A-1B, namely, that the gate signal must not rise too early (i.e., before clk rises to logic 1 and fb_2 is pulled down to logic 0), nor must it rise too late (i.e., gate has to rise to logic 1 before fb_2 returns to logic 1 at a time set by the self-timed feedback circuitry). Therefore, the additional circuitry of timing margin circuit 300, compared to the timing margin circuit of FIG. 2, neither improves, nor degrades the timing margins when running in pulsed mode. However, the additional logic circuitry of timing margin circuit 300 provides extra margin in the non-pulsed operating condition, which, since it is used at lower voltages where device variability is larger, is where the extra margin is needed.

Based on the d_mode_b mode selection control input being set to logic 0 during the master/slave operating mode (i.e., non-pulsed clock mode), input 314 of NOR gate 316 may accordingly be set to logic 0. When the nclk signal is high at input 301, the output 303 of inverter 302 is low, so input 312 of NOR gate 316 is also low. Accordingly, output 318 will be at logic 1, and output 321 of inverter 310 will be at logic 0. Thus, under this condition (i.e., with nclk high) NAND gate 308 has both inputs set to logic 0. Thus, output 320 is held high. As the nclk signal falls to logic 0 at input 301 of inverter 302, the output 303 of the inverter 302 pulls high and sets the other input 312 of the NOR gate 316 to logic 1, and also sets input 304 of NAND gate 308 to logic 1. However, NAND gate 308 will not switch (i.e., from logic 1) at this time because input 305 is still at logic 0. In the mean time, since input 314 of the NOR gate 316 is held at logic 0 while input 312 of NOR gate 316 is held at logic 1, the output 318 of the NOR gate 316 falls to logic 0. This subsequently causes the output 321 of inverter 310 to transition to logic 1. Here, the NOR gate 316 logically operates as an inverter. Input 305 of NAND gate 308 therefore transitions to logic 1, and since input 304 of NAND gate 308 is also at logic 1, output 320 of NAND gate 308 will be pulled down to logic 0.

In this mode of operation, output 320 of NAND gate 308 does not transition to logic 0 until the logic 1 at the output 321 of inverter 310 is generated and received at input 305 as a result of the logic levels propagating through NOR gate 316 and inverter 310. Thus, during this operating mode, the dly_nclk signal (i.e., delayed nclk) is delayed by inverter 302, NOR gate 316, inverter 310, and finally NAND gate 320. In this master/slave mode clock operation (i.e., d_mode_b=0), an increased delay path (i.e., 4 logic gate delays) is generated by the timing margin circuit 300 compared to (i.e., 2 logic gate delays) the pulsed mode clock operation (i.e., d_mode_b=1). By increasing the delay, the added delay associated with control input signal gate transitioning to logic 1 provides extra design margin and ensures that clk signal first rises before control input signal gate switches to logic 1, and that fb_2 is pulled down to logic 0 initially before input signal gate switches to logic 1 (i.e., the first timing constraint discussed above). Moreover, since a pulse mode operation is not required, the extra delay in the gate signal rising to logic 1 is permitted, since fb_1 is just held at a constant value of logic 1 in this mode, and the clk signal is not pulled down through transistors 176 and 174. Rather, the clk signal is pulled low only when nclk goes back high again, through the action of the NFET in inverter stage 166. Thus the additional circuitry provides extra design margin in non-pulsed mode, when this margin is most needed (i.e., due to the higher device delay variability at low voltage).

In the described embodiments, the clk and lclk (local clock) are both derived from the nclk signal, whereby clk is the inverse of nclk as a result of being inverted by logic stage 166 (see FIG. 2). The lclk signal is a delayed and buffered version of clk based on the clk signal propagating through NAND gate 190 (FIG. 1A) and NAND inverter 191 (FIG. 1A).

In terms of controlling the control input signal gate, as nclk falls to logic 0, this transition of nclk is delayed through inverter 302 and NAND gate inverter 308. Meanwhile, the clk signal at the output of inverter stage 166 is pulled high to logic 1. After the delay introduced by inverter 302 and NAND gate inverter 308, the dly_nclk signal at the output 320 of NAND gate inverter 308 is also pulled low to logic 0. Since the dly_nclk signal is coupled to the gate input of PFET device 170, the logic 0 of the dly_nclk signal switches the PFET 170 on and raises the control input signal gate to logic 1. As fb_2 is pulled high via the self-timed feedback path circuit 144 (FIG. 1A), the clk signal is pulled to ground at 172 by NFET devices 174 and 176. Specifically, NFET device 174 is switched on by the control input signal gate being at logic 1, while NFET device 176 is switched on by fb_2 being pulled high to logic 1. Thus, a pathway to ground 172 is created between nodes A and B, which pulls clk signal low in accordance with the predetermined pulse width operation. PFET device 170 may be part of the timing margin circuit 300.

Also, when nclk rises back up to logic 1, accordingly the dly_nclk signal at the output 320 of NAND gate inverter 308 is also pulled high to logic 1. This causes PFET 170 to turn off and NFET 185 to turn on. Based on this, control input signal gate transitions to logic 0, pulling clk back up high to logic 1 via PFET 180.

Figure 4:
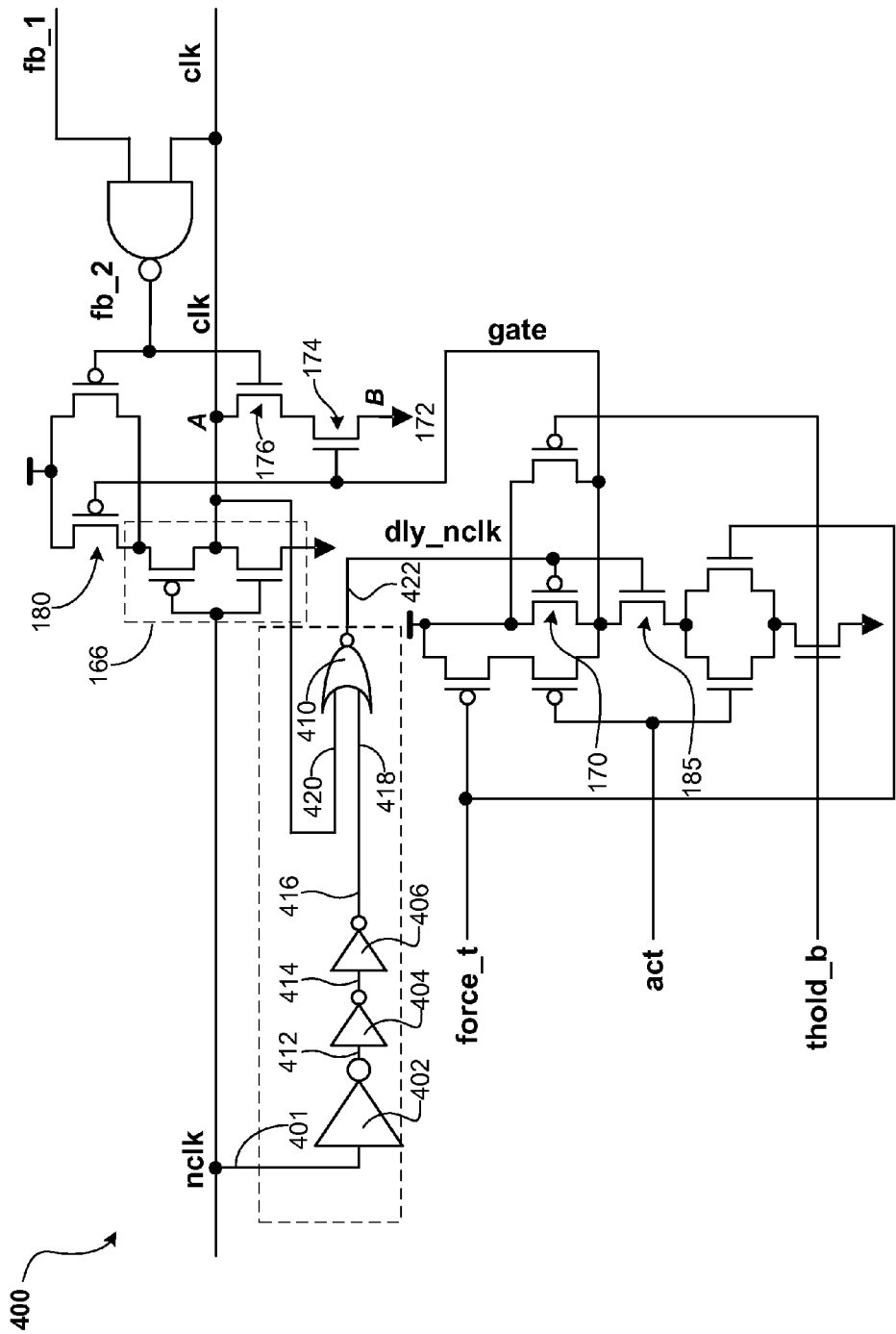
FIG. 4 illustrates an expanded view of another improved timing margin circuit incorporated within the clock buffer circuit of FIG. 1A, according to one exemplary embodiment.

FIG. 4 illustrates an expanded view of a timing margin circuit 400 incorporated within the clock buffer circuit of FIG. 1A, according to another exemplary embodiment. The timing margin circuit 400 may include a chain of series connected inverter gates 402-406 and a NOR gate 410. Input 401 of inverter 402 receives the nclk signal as an input clock signal. The output 412 of inverter 402 couples directly to the input of inverter 404, while the output 414 of inverter 404 couples directly to the input of inverter 406. The output 416 of inverter 406 couples to input 418 of the NOR gate 406. The other input 420 of NOR gate 410 receives the clk signal from inverter 166. The output 422 of NOR gate 410 generates the dly_nclk signal for controlling the gate signal control input. In an alternative embodiment, the chain of inverters 402, 404, 406 may be replaced by a single inverter logic gate having, for example, an equivalent propagation delay. Alternatively, according to yet another embodiment, the chain of inverters 402, 404, 406 (i.e., n=3) may be replaced by another longer odd number (e.g., n=5, 7, 9, etc.) of inverters.

Thus, in pulsed mode operation, with nclk initially at logic 1, input 418 to NOR gate 410 will be at logic 0, as will input 420. Then, as nclk falls to logic 0, if the logic signal gate is initially at a logic 0, the clk signal at the output of logic stage 166 is pulled high to logic 1 and received by input 420 of NOR gate 410. This will cause NOR gate 410 to immediately switch output 422 to logic 0, in turn pulling the gate signal high to logic 1. If the clk signal happens to rise more slowly than expected, for example due to device delay variability in, for example, inverter stage 166 or transistor 180, then the transition to logic 1 on the gate signal will also be correspondingly slowed down, helping to guarantee that the first timing constraint (i.e., that gate not be too early compared to the clk and fb_2 transitions) will still be met. Furthermore, if the clk signal happens to rise more quickly than expected, again for example because of device delay variability, then the rising transition on gate will be correspondingly sped up, helping to guarantee that the second timing constraint (i.e., that gate not rise too late compared to when fb_2 rises, as a result of the self-timed feedback loop). Input 418 of the NOR gate will also transition to logic 1 some time after nclk falls to logic 0. This could also cause the NOR 410 to pull output 422 to logic 0. However, the delays of the three (3) inverters 402, 404, 406 can be adjusted so that NOR input 418 is always later than input 420, guaranteeing that the beneficial timing relationships between clk, gate, and fb_2 are maintained.

In the case where gate is at logic 1 when nclk falls, then clk will stay at logic 0 (i.e., no clock pulse is generated under these circumstances). In this case, since nclk falls to logic 0 at input 401 of inverter 402, the output 412 of inverter 402 switches to logic 1. Inverter 404 receives the logic 1 from output 412 and generates a logic 0 at its output 414. Inverter 406 then receives the logic 0 from output 414 and generates a logic 1 at its output 416, which couples to input 418 of the NOR gate 410. Thus, through the chain of inverters 402-406, the logic 1 reaches the NOR gate input 418 after 3 gate delays, at which point the output 422 will then be pulled to logic 0. This may serves to limit the hold time specification for act, force_t, and thold_b, which may be free to be updated after dly_nclk is pulled low. Alternatively, in non-pulsed mode, the operation is similar to that described above for pulsed mode.

Generally, if the delay from falling nclk to falling dly_nclk is too short, then gate may be pulled high to logic 1 too early, before clk has transitioned to logic 1. This may, therefore, lead to a failure of the local clock buffer circuit 100A, 100B (FIGS. 1A & 1B). Thus, the more logic gate delays that are added, the more robust the circuit operation. In contrast, however, too much gate delay may cause operational failures (in pulsed mode only) when, for example, clk rises more quickly than expected, and the delay path experienced by nclk to generate dly_nclk is slower than expected due to variability. In this scenario, the trailing edge of clk can be affected because gate hasn't been restored to logic 1 in sufficient time for fb_1 to pull low and, thus, pull fb_2 high. The timing margin circuit 400 addresses both scenarios, whereby if clk is rising slowly, there is extra margin since the NOR gate 410 will not switch high until clk is high (or until after all of the path delay through invertors 402-406). However, if clk rises quickly, even with the extra inverters 402-406 added, the pull down of dly_nclk through the NOR gate 410 is sped up by being triggered by rising clk without waiting for the propagation through the inverters. This is because the logic 1 of the clk at input 420 of the NOR gate 410 ensures that dly_nclk transitions to logic 0 and gate transitions to logic 1 regardless of the logic state received at input 418 from the inverter chain 402-406.

In terms of controlling the control input signal gate, since the dly_nclk signal at output 422 of NOR gate 410 is coupled to the gate input of PFET device 170, the logic 0 of the dly_nclk signal switches the PFET 170 on and raises the control input signal gate to logic 1. As fb_2 is pulled high via the self-timed feedback path circuit 144 (FIG. 1A), the clk signal is pulled to ground at 172 by NFET devices 174 and 176. Specifically, NFET device 174 is switched on by the control input signal gate being at logic 1, while NFET device 176 is switched on by fb_2 being pulled high to logic 1. Thus, a pathway to ground 172 is created between nodes A and B, which pulls clk signal low in accordance with the limited pulse width operation. PFET device 170 may be part of the timing margin circuit 400.

Alternatively, when nclk rises back up to logic 1, accordingly the dly_nclk signal at the output 422 of NOR gate 410 is pulled high to logic 1. Thus, PFET 170 is turned off and NFET 185 is turned on. Based on this, control input signal gate transitions to logic 0, keeping clk high at logic 1 via PFET 180.

Figure 5:
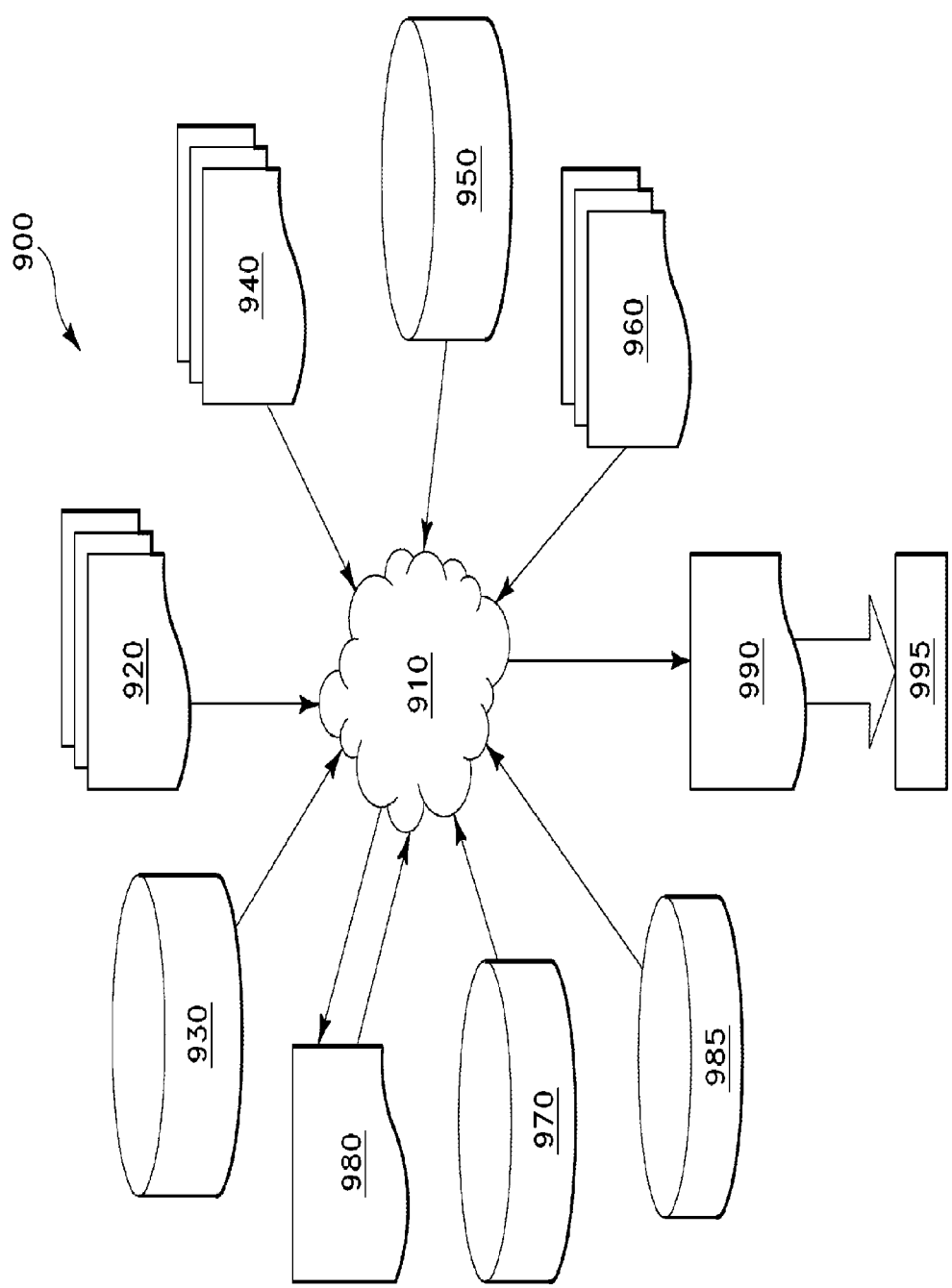
FIG. 5 is a flow diagram of a design process used in semiconductor design, manufacture, and/or test.

FIG. 5 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 3 and 4. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. In one embodiment, the design structure 920 comprises design data used in a design process and comprising information describing the embodiments of the invention with respect to the structures as shown in FIGS. 3 and 4. The design data in the form of schematics or HDL, a hardware-description language (e.g., Verilog, VHDL, C, etc.) may be embodied on one or more machine readable media. For example, design structure 920 may be a text file, numerical data or a graphical representation of the one or more embodiments of the invention shown in FIGS. 3 and 4. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIGS. 3 and 4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3 and 4 to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIGS. 3 and 4. In one embodiment, design structure 990 may comprise a compiled, executable HDL simulation model that functionally simulates the devices shown in FIGS. 3 and 4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 3 and 4. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A timing margin circuit of a local clock buffer circuit located within a microelectronic device, the timing margin circuit comprising:
    a self-timed feedback circuit;
    an inverter logic gate having an inverter input and an inverter output, the inverter input receiving an input clock signal;

a NAND logic gate having a first NAND input that is coupled to the inverter output, a second NAND input, and a NAND output; and a logic device having a first logic device input that is coupled to the inverter output, a second logic device input that receives a mode selection signal, and a logic device output that couples to the second NAND input, the NAND logic gate generating, at the NAND output, a first time delayed input clock signal having a first time delay based on the mode selection signal being at a first logic state, and a second time delayed input clock signal having a second time delay based on the mode selection signal being at a second logic state, the first and the second time delayed input clock signal controlling a falling edge transition of a local clock signal derived from the input clock signal, wherein the first time delayed input clock signal controls the falling edge transition of the local clock signal to occur within a time window that follows a rising edge transition of the local clock and terminates at a finite pulse interval determined by the self-timed feedback circuit.

2. The circuit of claim 1, wherein the mode selection signal being at the first logic state comprises a pulsed mode clock operation.

3. The circuit of claim 2, wherein the mode selection signal being at the second logic state comprises a master/slave mode clock operation.

4. The circuit of claim 3, wherein the first time delayed input clock signal has a shorter time delay compared to the second time delayed input clock signal.

5. The circuit of claim 1, wherein the logic device comprises:

a NOR logic gate having a first NOR input coupled to the inverter output, a second NOR input that receives the mode selection signal, and a NOR output; and an other inverter logic gate having an other inverter input and an other inverter output, the other inverter input coupled to the NOR output, and the other inverter output coupled to the second NAND input.

6. The circuit of claim 1, further comprising:

a FET device coupled to the NAND output, wherein, upon the NAND output transitioning to a logic low level, the FET device pulls a clock gating signal to a logic high level for activating the trailing edge transition of the local clock signal derived from the input clock signal.

7. The circuit of claim 6, wherein the FET comprises a PFET device.

8. The circuit of claim 1, further comprising:

a FET device coupled to the NAND output, wherein, upon the NAND output transitioning to a logic high level, the FET device pulls a clock gating signal to a logic low level for activating a rising edge transition of the local clock signal derived from the input clock signal.

9. The circuit of claim 8, wherein the FET comprises a NFET device.

10. The circuit of claim 1, wherein based on the mode selection signal being at the first logic state, a delay path through the inverter logic gate and the NAND logic gate delays the input clock signal to generate the first time delayed input clock signal.

11. The circuit of claim 5, wherein based on the mode selection signal being at the second logic state, a delay path through the inverter logic gate, the NOR logic gate, the other inverter logic gate, and the NAND logic gate delays the input clock signal to generate the second time delayed input clock signal.

12. A timing margin circuit of a local clock buffer circuit located within a microelectronic device, the timing margin circuit comprising:

a chain of inverters having an inverter input and an inverter output, the inverter input receiving an input clock signal;

a NOR logic gate having a first NOR input coupled to the inverter output of the chain of inverters, a second NOR input coupled to an output clock signal that is the inverse of the input clock signal, and a NOR output, the NOR gate generating, at the NOR output, a time delayed input clock signal for controlling a falling edge transition of the output clock signal following the output clock signal completing a transition to a logic high;

a FET device coupled to the NOR output, wherein, upon the NOR output transitioning to a logic low level, the FET device pulls a clock gating signal to a logic high level for activating the trailing edge transition of the output clock signal;

a first NFET device having a first FET gate that receives the clock gating signal, a first FET source coupled to ground, and a first FET drain; and a second NFET device having a second FET gate that receives a self-timed feedback signal that is derived from the output clock signal, a second FET source coupled to the first FET drain, and a second FET drain coupled to a transmission medium carrying the output clock signal;

wherein upon the clock gating signal and the self-timed feedback signal both transitioning to a logic high level, the trailing edge of the output clock signal is pulled to ground based both the first and the second NFET device being conductive.

13. The circuit of claim 12, wherein the FET comprises a PFET device.

14. The circuit of claim 12, further comprising:

a FET device coupled to the NOR output, wherein, upon the NOR output transitioning to a logic high level, the FET device pulls a clock gating signal to a logic low level for activating a rising edge transition of the output clock signal.

15. The circuit of claim 14, wherein the FET comprises a NFET device.

16. A method of providing a timing margin for a local clock buffer circuit located within a microelectronic device, the method comprising:

receiving an input clock signal;

delaying the received input clock signal along a first delay path having a first chain of inverter logic according to a first operating mode;

controlling a first falling edge transition of an output clock signal that is derived from the input clock signal based on the delaying of the input clock along the first delay path;

delaying the received input clock signal along a second delay path having a second chain of inverter logic according to a second operating mode; and controlling a second falling edge transition of the output clock signal based on the delaying of the input clock along the second delay path, the first falling edge transition of the output clock signal corresponding to a pulse mode operation of the local buffer, and the second falling edge transition of the output clock signal corresponding to a master/slave operation of the local buffer, wherein the first falling edge transition of the output clock signal occurs within a time window that follows a rising edge transition of the output clock and terminates at a finite pulse interval determined by a self-timed feedback circuit.

17. The method of claim 16, wherein:

the first chain of inverters comprises a first inverter logic gate and a NAND logic gate, the NAND logic gate logically operating as an inverter; and the second chain of inverters comprises the first inverter logic gate, a NOR logic gate logically operating as an inverter, a second inverter logic gate, and a NAND logic gate.

* * * * *